(12) United States Patent
Tamaki et al.

(10) Patent No.: US 11,737,365 B2
(45) Date of Patent: Aug. 22, 2023

(54) THERMOELECTRIC CONVERSION TECHNIQUE

(71) Applicant: Panasonic Intellectual Property Management Co., Ltd., Osaka (JP)

(72) Inventors: Hiromasa Tamaki, Osaka (JP); Hiroki Sato, Shiga (JP); Tsutomu Kanno, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 108 days.

(21) Appl. No.: 17/517,043

(22) Filed: Nov. 2, 2021

(65) Prior Publication Data

US 2022/0059746 A1 Feb. 24, 2022

Related U.S. Application Data

(63) Continuation of application No. PCT/JP2020/027534, filed on Jul. 15, 2020.

(30) Foreign Application Priority Data

Sep. 9, 2019 (JP) ................................. 2019-163902

(51) Int. Cl.
*H10N 10/853* (2023.01)
*C01G 29/00* (2006.01)
(Continued)

(52) U.S. Cl.
CPC ......... *H10N 10/853* (2023.02); *C01G 29/006* (2013.01); *C01G 30/002* (2013.01);
(Continued)

(58) Field of Classification Search
CPC .... C01G 30/002; C01G 29/006; H10N 10/17; H10N 10/853
See application file for complete search history.

(56) References Cited

U.S. PATENT DOCUMENTS

2014/0349435 A1 11/2014 Murai et al.
2017/0117453 A1 4/2017 Tamaki et al.

FOREIGN PATENT DOCUMENTS

JP 2003-332637 11/2003
JP 2013-008747 1/2013
(Continued)

OTHER PUBLICATIONS

Shuai et al., "Higher thermoelectric performance of Zintl phases (Eu0.5Yb0.5)1-xCaxMg2Bi2 by band engineering and strain fluctuation", PNAS, Research Article, Physical Sciences, Jul. 6, 2016, 113 (29) E4125-E4132, https://doi.org/10.1073/pnas.1608794113 (Year: 2016).*

(Continued)

*Primary Examiner* — Tae-Sik Kang
(74) *Attorney, Agent, or Firm* — McDermott Will & Emery LLP

(57) ABSTRACT

The present disclosure provides a thermoelectric conversion material having a composition represented by a chemical formula of $Ba_{1-a-b-c}Sr_bCa_cK_aMg_2Bi_{2-d}Sb_d$. In the chemical formula, the following relationships are satisfied: $0.002 \leq a \leq 0.1$, $0 \leq b$, $0 \leq c$, $a+b+c \leq 1$, and $0 \leq d \leq 2$. In addition, the thermoelectric conversion material has a $La_2O_3$-type crystal structure.

6 Claims, 4 Drawing Sheets

(51) Int. Cl.
*C01G 30/00* (2006.01)
*H10N 10/17* (2023.01)

(52) U.S. Cl.
CPC ......... *H10N 10/17* (2023.02); *C01P 2002/72* (2013.01); *C01P 2006/32* (2013.01); *C01P 2006/40* (2013.01)

(56) References Cited

FOREIGN PATENT DOCUMENTS

| JP | 2013-157362 | 8/2013 |
|---|---|---|
| WO | 2017/072982 | 5/2017 |

OTHER PUBLICATIONS

Le et al., "Three-dimensional topological critical Dirac semimetal in AMgBi (A = K, Rb, Cs)", Physical Review B 96, 115121 (2017). (Year: 2017).*

International Search Report of PCT application No. PCT/JP2020/027534 dated Oct. 20, 2020.

Andrew F. May et al., "Structure and Properties of Single Crystalline CaMg2Bi2, EuMg2Bi2, and YbMg2Bi2", Inorganic Chemistry, 50, Oct. 14, 2011, 11127-11133.

Wanyue Peng et al., "Limits of Cation Solubility in AMg2Sb2 (A = Mg, Ca, Sr, Ba) Alloys", Materials 2018, 12, 586, Feb. 15, 2019.

Jianming Chen et al., "First-Principles Predictions of Thermoelectric Figure of Merit for Organic Materials: Deformation Potential Approximation", Journal of Chemical Theory and Computation, 8, Aug. 6, 2012, pp. 3338-3347.

Heng Wang et al., "Chapter 1 Material Design Considerations Based on Thermoelectric Quality Factor", Thermoelectric Nanomaterials, Springer, Series in Materials Science vol. 182, ch. 1,2013, pp. 3-32.

J. Yang et al., "Strain field fluctuation effects on lattice thermal conductivity of ZrNiSn-based thermoelecliic compounds". Applied Physics Letters, vol. 85, No. 7, Aug. 10, 2004, pp. 1140-1142.

Jun Yan et al., "Material descriptors for predicting thermoelectric performance", Energy & Environmental Science, 8, Dec. 19, 2014.

H. Julian Goldsmid, "Introduction to Thermoelectricity", "Chapter 3 Thermoelectric Properties of Metals and Semiconductors", Springer Series in Materials Science, 2010.

Jing Shuai et al., "Thermoelectric Properties of Zintl compound Ca1-xNaxMg2Bi1.98", Applied Physics Letters vol. 108, 183901-1-183901-4, May 3, 2016.

* cited by examiner

THERMOELECTRIC CONVERSION TECHNIQUE

BACKGROUND

1. Technical Field

The present disclosure relates to a thermoelectric conversion material and a thermoelectric conversion device. The present disclosure also relates to a method for obtaining electrical power by using the thermoelectric conversion material and to a method for transporting heat by using the thermoelectric conversion material.

2. Description of the Related Art

When a temperature difference occurs between opposite ends of a thermoelectric conversion material, an electromotive force is generated in proportion to the temperature difference that has occurred. This phenomenon, in which thermal energy is converted into electrical energy, is known as the Seebeck effect. The thermoelectric generation technology is a technology for converting thermal energy directly into electrical energy by utilizing the Seebeck effect.

As is well known in the technical field of thermoelectric conversion materials, the performance of a thermoelectric conversion material that is used in a thermoelectric conversion device is evaluated by a figure of merit ZT, which is a figure of merit rendered dimensionless by multiplying a figure of merit Z by an absolute temperature T. ZT is represented by $ZT=S^2\sigma T/\kappa$, which uses a Seebeck coefficient S, an electrical conductivity $\sigma$, and a thermal conductivity $\kappa$ of a material. The higher the ZT value, the higher the thermoelectric conversion efficiency.

Japanese Patent No. 6127281 discloses an n-type thermoelectric conversion material primarily formed of $Mg_3(Sb, Bi)_2$. Non-Patent Literature 1 (A. F. May, M. A. McGuire, D. J. Singh, R. Custelcean and G. E. Jellison, Jr., Inorganic Chemistry, 50, 2011, pp. 11127-11133) and Non-Patent Literature 2 (W. Peng and A. Zevalkink, Materials, 12, 2018, p. 586) disclose that a multinary compound of $(Ba, Sr, Ca)Mg_2Bi_2$ can be stably synthesized.

SUMMARY

One non-limiting and exemplary embodiment provides a novel thermoelectric conversion material.

In one general aspect, the techniques disclosed here feature a thermoelectric conversion material having a composition represented by a chemical formula of $Ba_{1-a-b-c}Sr_bCa_cK_aMg_2Bi_{2-d}Sb_d$. In the chemical formula, the following relationships are satisfied: $0.002 \leq a \leq 0.1$, $0 \leq b$, $0 \leq c$, $a+b+c \leq 1$, and $0 \leq d \leq 2$. In addition, the thermoelectric conversion material has a $La_2O_3$-type crystal structure.

The present disclosure provides a novel thermoelectric conversion material.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Embodiments of the present disclosure will now be described with reference to the drawings.

A thermoelectric conversion material of the present disclosure has a composition represented by the following chemical formula (I).

$$Ba_{1-a-b-c}Sr_bCa_cK_aMg_2Bi_{2-d}Sb_d \qquad (I)$$

Figure 1:
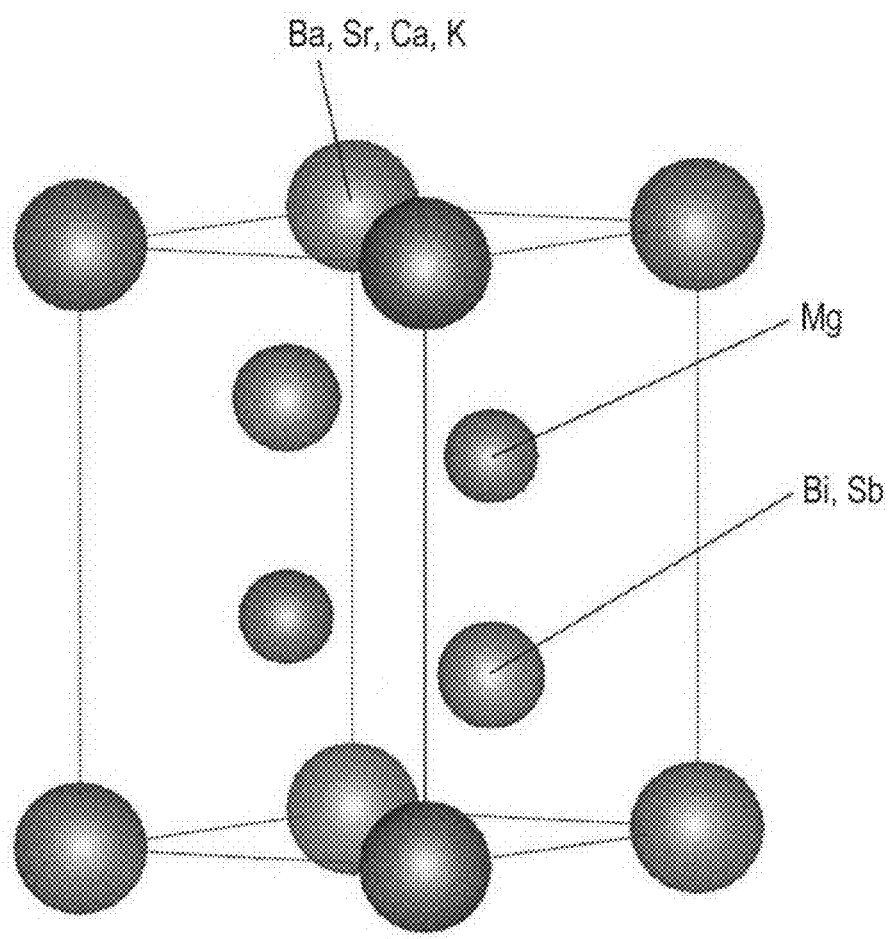
FIG. 1 is a schematic diagram illustrating a crystal structure of $(Ba, Sr, Ca, K)Mg_2(Bi, Sb)_2$.

In the chemical formula, the following relationships are satisfied:

$0.002 \leq a \leq 0.1$, $0 \leq b$, $0 \leq c$, $a+b+c \leq 1$, and $0 \leq d \leq 2$ The compound represented by formula (I) has a crystal structure called a $La_2O_3$ type or a $CaAl_2Si_2$ type, as illustrated in FIG. 1. The crystal structure belongs to the space group P3-m1. The $La_2O_3$ type is typically an $\alpha$-$La_2O_3$ type. A compound known to have the same crystal structure, that is, the $La_2O_3$-type crystal structure, is $Mg_3(Sb, Bi)_2$, and Japanese Patent No. 6127281 discloses an n-type thermoelectric conversion material primarily formed of $Mg_3(Sb, Bi)_2$. The thermoelectric conversion material of Japanese Patent No. 6127281 has high figures of merit ZT, namely, 0.5 at a temperature of 300K and 1.5 at a temperature of 700K. However, in a thermoelectric conversion module illustrated in FIG. 3 as one example, it is desirable to use a combination of a p-type material and an n-type material that have similar operating temperature ranges and coefficients of thermal expansion. Accordingly, there is a need to come up with a p-type material that can constitute a counterpart to the above-mentioned n-type thermoelectric conversion material. The present inventors conceived of a material primarily formed of $(Ba, Sr, Ca)Mg_2Bi_2$.

Non-Patent Literature 1 and Non-Patent Literature 2 disclose that a multinary compound of $(Ba, Sr, Ca)Mg_2Bi_2$ can be stably synthesized. However, neither Non-Patent Literature 1 nor Non-Patent Literature 2 suggests a dopant that can adjust the concentration of the carrier necessary for improving the figure of merit ZT. The present inventors performed studies to find an optimal dopant and discovered that K (potassium) is an effective dopant for extracting high p-type performance from a material primarily formed of (Ba, Sr, Ca)Mg$_2$Bi$_2$.

The thermoelectric conversion material of the present disclosure has a La$_2$O$_3$-type crystal structure. Typically, the thermoelectric conversion material of the present disclosure has a p-type polarity.

Manufacturing Method

A bulk body of (Ba, Sr, Ca, K)Mg$_2$(Bi, Sb)$_2$ can be manufactured, for example, by a method in which a heating step for forming an alloy, which is a precursor, is combined with mechanical alloying process or a spark plasma sintering process. Another possible method for the manufacturing is a metal flux method as disclosed in Non-Patent Literature 1. Note that these manufacturing methods are non-limiting examples.

The degree to which at least one site selected from the Ba site, the Sr site, and the Ca site is substituted with K can be controlled by varying an amount of K to be included in the starting materials, with respect to an amount of at least one selected from Ba, Sr, and Ca in the starting materials. The degree to which the Bi site is substituted with Sb can be controlled by varying an amount of Sb to be included in the starting materials, with respect to an amount of Bi in the starting materials.

An example of the manufacturing method is described below. Materials including respective necessary elements selected from Ba, Ca, Sr, K, Mg, Bi, and Sb are weighed in a stoichiometric ratio. The weighed materials except the material including Bi are introduced into a crucible. The materials may each be a single element material. The crucible is, for example, a crucible made from boron nitride (BN). Subsequently, the materials in the crucible are melted in an inert gas atmosphere to be alloyed. For the melting, a resistance heating furnace may be used, for example. Examples of the inert gas include argon. A temperature for the melting is greater than or equal to 700° C., for example. Subsequently, the resulting precursor alloy and the material including Bi are subjected to a grinding and mixing process. For the process, a planetary ball mill process may be employed, for example. A typical example of the process is as follows. The precursor alloy and the material including Bi are placed in a stainless steel vessel with stainless steel balls, and after the vessel is sealed in an argon atmosphere, the process using a planetary ball mill process is carried out. Subsequently, the alloy powder produced by the process is sintered by using a spark plasma sintering process, and, accordingly, a bulk sintered body of (Ba, Sr, Ca, K)Mg$_2$(Bi, Sb)$_2$ is obtained. For the spark plasma sintering process, a die made from graphite may be used. Typically, in the spark plasma process, the powder placed in the die is heated by a pulsed current under pressure. For example, the heating temperature is greater than or equal to 700° C. and less than or equal to 800° C. For example, the heating time is greater than or equal to 20 minutes. Using this method, manufacturing of a dense sintered body having, for example, a relative mass density of greater than 95% can be achieved.

Thermoelectric Conversion Device

Figure 2:
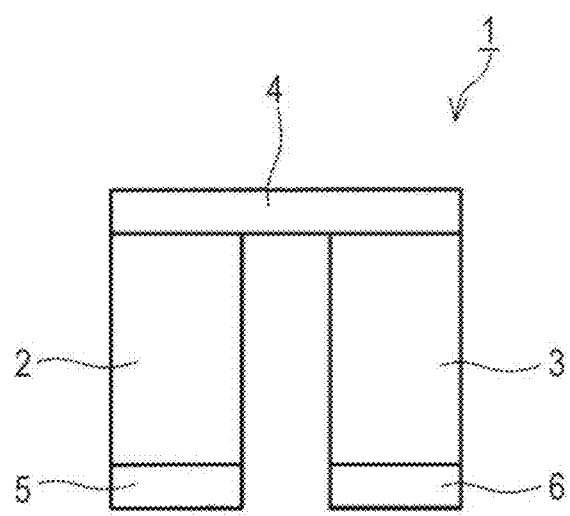
FIG. 2 is a schematic diagram illustrating an example of a thermoelectric conversion device of the present disclosure.

The thermoelectric conversion material of the present disclosure enables a realization of a thermoelectric conversion device. As illustrated in FIG. 2, an example of the thermoelectric conversion device comprises: a p-type thermoelectric converter 2, an n-type thermoelectric converter 3, a first electrode 4, a second electrode 5, and a third electrode 6. A first end of the p-type thermoelectric converter 2 and a first end of the n-type thermoelectric converter 3 are electrically connected to each other via the first electrode 4. A second end of the p-type thermoelectric converter 2 is electrically connected to the second electrode 5. A second end of the n-type thermoelectric converter 3 is electrically connected to the third electrode 6. The p-type thermoelectric converter 2 comprises the thermoelectric conversion material of the present disclosure. The n-type thermoelectric converter 3 comprises a thermoelectric conversion material having a Mg$_3$(Sb, Bi)$_2$ system, for example. Specifically, the thermoelectric conversion material may be, for example, a thermoelectric conversion material formed of a composition represented by chemical formula of Mg$_{3.08}$Sb$_{1.49}$Bi$_{0.49}$Se$_{0.02}$.

In the above-described thermoelectric conversion device, electrical power can be obtained when a temperature difference is formed such that, for example, the first end of the p-type thermoelectric converter 2 and the first end of the n-type thermoelectric converter 3 have a high temperature, whereas the second end of the p-type thermoelectric converter 2 and the second end of the n-type thermoelectric converter 3 have a low temperature.

Furthermore, in the thermoelectric conversion device described above, when a current is applied, heat is transported from the first end of the p-type thermoelectric converter 2 and the first end of the n-type thermoelectric converter 3 to the second end of the p-type thermoelectric converter 2 and the second end of the n-type thermoelectric converter 3. When the polarity of the current is reversed, the direction in which heat is transported is also reversed, that is, heat is transported from the second end of the p-type thermoelectric converter 2 and the second end of the n-type thermoelectric converter 3 to the first end of the p-type thermoelectric converter 2 and the first end of the n-type thermoelectric converter 3.

Figure 3:
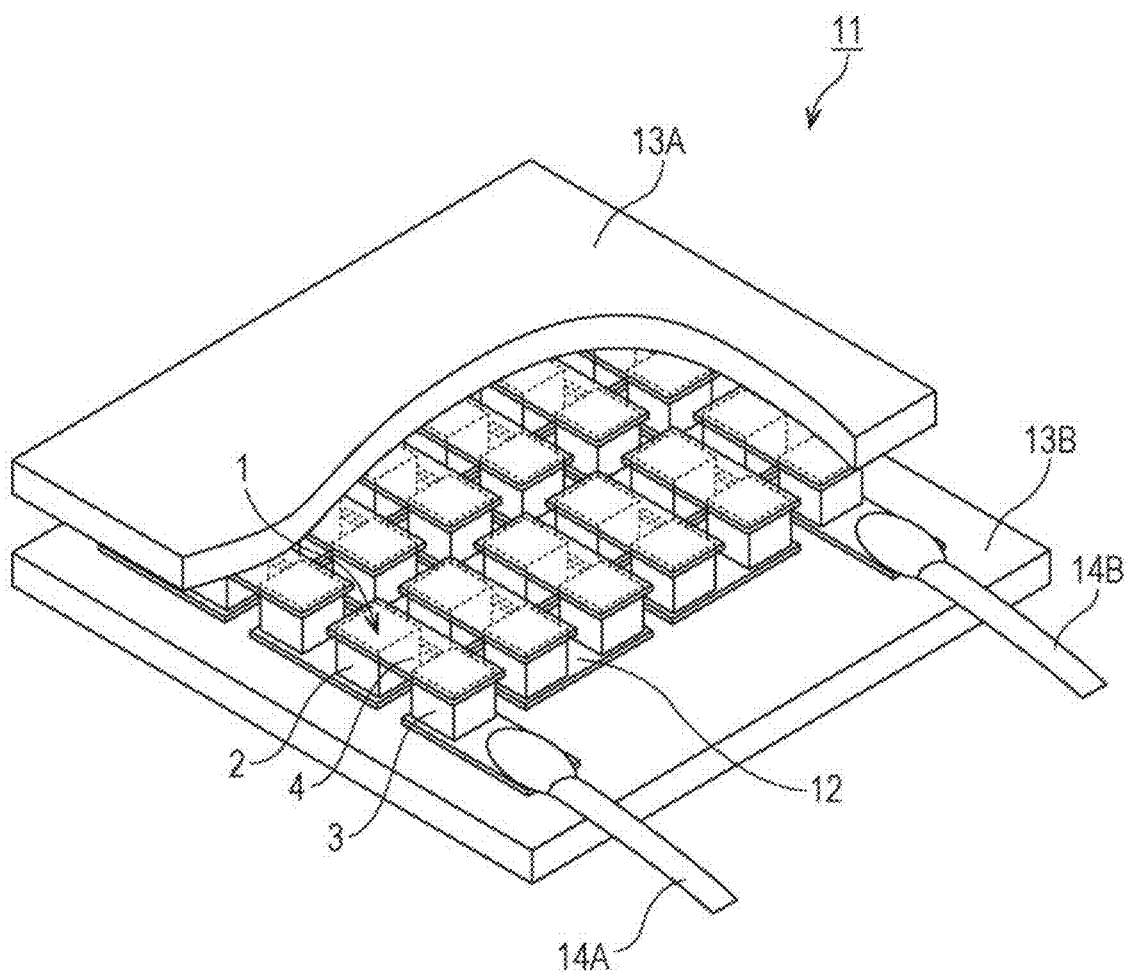
FIG. 3 is a schematic diagram illustrating an example of a thermoelectric conversion module that comprises the thermoelectric conversion device of the present disclosure.

With the thermoelectric conversion device described above, a thermoelectric conversion module can be constructed, for example. As illustrated in FIG. 3, an example of a thermoelectric conversion module 11 comprises a plurality of thermoelectric conversion devices 1. In this example, the plurality of thermoelectric conversion devices 1 are arranged between substrates 13A and 13B such that units each comprising the p-type thermoelectric converter 2 and the n-type thermoelectric converter 3 are disposed in a regular pattern. The units are electrically connected to one another in series via connection electrodes 12, from an output line 14A of the thermoelectric conversion module 11 to an output line 14B thereof. In each of the units, a connection electrode 12 that serves as the third electrode 6, the n-type thermoelectric converter 3, the first electrode 4, the p-type thermoelectric converter 2, and a connection electrode 12 that serves as the second electrode 5 are electrically connected in this order.

Method for Obtaining Electrical Power by Using Thermoelectric Conversion Material In the present embodiment, for example, an electrode may be provided at a first end of the thermoelectric conversion material of present disclosure, another electrode may be provided at a second end thereof, and a temperature difference may be formed such that the first end has a high temperature, and the second end has a low temperature; in this case, the p-type carriers migrate from the first end to the second end, and, accordingly, electrical power can be obtained.

Method for Transporting Heat by Using Thermoelectric Conversion Material

Furthermore, in the present embodiment, a current may be applied to the thermoelectric conversion material of present disclosure; in this case, the Peltier effect is produced, and, accordingly, heat is transported from a first end of the thermoelectric conversion material to a second end thereof. Using this method, cooling and heat regulation that use a thermoelectric conversion material can be achieved.

EXAMPLES

The thermoelectric conversion material of the present disclosure will now be described in more detail with reference to examples. Note that the thermoelectric conversion material of the present disclosure is not limited to the specific embodiments described below.

Preparation of $(Ba, Sr, Ca, K)Mg_2(Bi, Sb)_2$ keBulk sintered bodies of $(Ba, Sr, Ca, K)Mg_2(Bi, Sb)_2$ were prepared by the above-described method in which a heating step for forming an alloy, which is a precursor, was combined with a spark plasma sintering process. The crucible used was a crucible made from BN. The melting was carried out in an argon atmosphere. For the melting, a resistance heating furnace set to 700° C. was used. The grinding and mixing process was carried out according to the typical example described above. For the spark plasma sintering process, a die made from graphite was used. The heating temperature and the heating time were set to be 700° C. and 30 minutes, respectively.

Analysis of Crystal Structure

Figure 4:
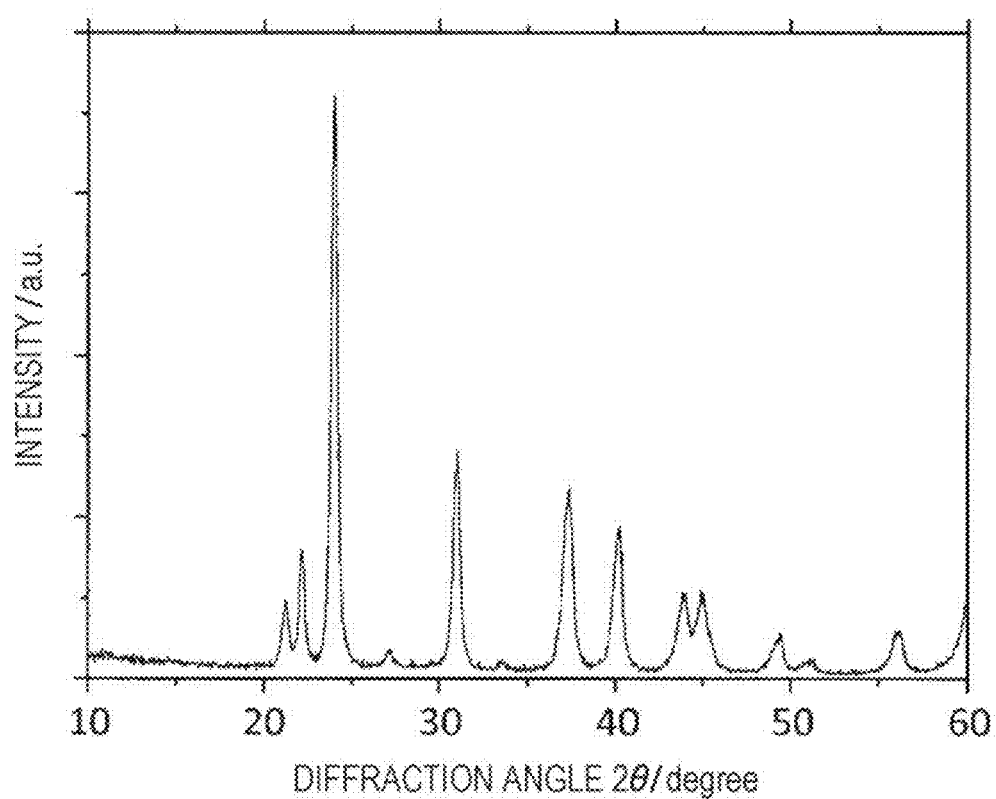
FIG. 4 is a graph showing an X-ray diffraction spectrum of a thermoelectric conversion material, which was prepared in an Example and had a composition of $Ba_{0.5}Ca_{0.48}K_{0.02}Mg_2Bi_2$.

Non-Patent Literature 2 discloses that regarding $(Ba, Sr, Ca)Mg_2Bi_2$ crystal materials, a solid solution phase can be formed among $BaMg_2Bi_2$, $SrMg_2Bi_2$, and $CaMg_2Bi_2$, and that the crystal structure of such a material belongs to the space group P3-m1. The crystal structure of each of the prepared sintered bodies was determined on the basis of an X-ray crystal diffraction method. For the X-ray crystal diffraction method, a RINT-TTR, manufactured by Rigaku Corporation, was used. FIG. 4 shows an X-ray diffraction spectrum of $Ba_{0.5}Ca_{0.48}K_{0.02}Mg_2Bi_2$ (Example 4), which is a representative example. It was observed that all of the prepared sintered bodies had a single phase $\alpha$-$La_2O_3$-type crystal structure as shown in FIG. 4.

Determination of Compositional Ratio

The chemical composition of each of the prepared sintered bodies was analyzed by using energy dispersive X-ray spectroscopy. For the analysis, an XFlash 6|10, manufactured by Bruker Corporation, was used.

Evaluation of Thermoelectric Conversion Properties

Each of the prepared sintered bodies was cut into a strip shape and a pellet shape to form specimens. The Seebeck coefficient S and the electrical conductivity σ within a temperature range of 330 to 570K were evaluated by using the strip-shaped specimen. The thermal conductivity κ within the temperature range of 330 to 570K was evaluated by using the pellet-shaped specimen. For the evaluation of the Seebeck coefficient and the electrical conductivity, a ZEM-3, manufactured by Advance Riko, Inc., was used. For the evaluation of the thermal conductivity, an LFA 457, manufactured by Netzsch, was used. The temperatures set for evaluating the properties were 330K, 370K, 430K, 470K, 530K, and 570K.

For details of a method for evaluating the Seebeck coefficient, see U.S. patent application Ser. No. 14/847,321 (International Application No. PCT/JP2014/001882), U.S. patent application Ser. No. 14/847,362 (International Application No. PCT/JP2014/001883), and U.S. patent application Ser. No. 14/718,491 (International Application No. PCT/JP2014/001885).

The following tables 1 to 3 show the composition of the prepared sintered bodies and the results of evaluation of the thermoelectric conversion properties at a temperature of 330K of the sintered bodies. Tables 1 to 3 also show a figure of merit $ZT_{max}$, which is a figure of merit at 470K or 570K, at which the highest figure of merit ZT was achieved. The compositions of the sintered bodies were controlled by selection of the elements to be included in the materials and the weighing ratio between the materials.

TABLE 1

| | Composition | $S_{330K}$ (μV/K) | $\sigma_{330K}$ (S/cm) | $\kappa_{330K}$ (W/mK) | $ZT_{330K}$ | $ZT_{max}$ ($T_{max}$) |
|---|---|---|---|---|---|---|
| Comparative Example 1 | $BaMg_2Bi_2$ | 233 | 51 | 1.74 | 0.05 | 0.14 (470K) |
| Example 1 | $Ba_{0.98}K_{0.02}Mg_2Bi_2$ | 110 | 456 | 2.08 | 0.09 | 0.18 (470K) |

Table 1 shows properties of a thermoelectric conversion material having a composition of $Ba_{1-a}K_aMg_2Bi_2$, in which the Ba site was substituted with K. In the thermoelectric conversion material, a p-type property, in which S is a positive value, was achieved; in addition, the electrical conductivity 330K was higher by an order of magnitude than that of Comparative Example 1, and ZT was improved over a wide temperature range of 330 to 570K.

TABLE 2

| | Composition | $S_{330K}$ (μV/K) | $\sigma_{330K}$ (S/cm) | $\kappa_{330K}$ (W/mK) | $ZT_{330K}$ | $ZT_{max}$ ($T_{max}$) |
|---|---|---|---|---|---|---|
| Comparative Example 2 | $CaMg_2Bi_2$ | 191 | 80 | 2.05 | 0.05 | 0.22 (570K) |
| Example 2 | $Ca_{0.98}K_{0.02}Mg_2Bi_2$ | 119 | 489 | 2.54 | 0.09 | 0.27 (570K) |

Table 2 shows properties of a thermoelectric conversion material having a composition of $Ca_{1-a}K_aMg_2Bi_2$, in which the Ca site was substituted with K. In the thermoelectric conversion material, a p-type property, in which S is a positive value, was achieved; in addition, the electrical conductivity $\sigma_{330K}$ was higher by an order of magnitude than that of Comparative Example 2, and ZT was improved over a wide temperature range of 330 to 570K.

TABLE 3

| Composition | $S_{330K}$ (µV/K) | $\sigma_{330K}$ (S/cm) | $\kappa_{330K}$ (W/mK) | $ZT_{330K}$ | $ZT_{max}$ ($T_{max}$) |
|---|---|---|---|---|---|
| Example 3  $Sr_{0.8}Ca_{0.18}K_{0.02}Mg_2Bi_2$ | 134 | 556 | 2.15 | 0.16 | 0.37 (570K) |
| Example 4  $Ba_{0.5}Ca_{0.48}K_{0.02}Mg_2Bi_2$ | 144 | 436 | 1.29 | 0.23 | 0.50 (570K) |
| Example 5  $Ca_{0.5}Ba_{0.48}K_{0.02}Mg_2Bi_{1.8}Sb_{0.2}$ | 154 | 281 | 0.99 | 0.23 | 0.51 (570K) |

Table 3 shows properties of a thermoelectric conversion material having a composition of $Sr_bCa_cK_aMg_2Bi_2$, a thermoelectric conversion material having a composition of $Ba_{1-a-c}Ca_cK_aMg_2Bi_2$, and a thermoelectric conversion material having a composition of $Ba_{1-a-c}Ca_cK_aMg_2Bi_{2-d}Sb_d$. In these thermoelectric conversion materials, a p-type property, in which S is a positive value, was achieved, and in addition, ZT was further improved as a result of employing a quinary or higher composition.

As shown in Tables 1 to 3, p-type high thermoelectric conversion properties were achieved by substituting the (Ba, Sr, Ca)$Mg_2$(Bi, Sb)$_2$ solid solution system with K.

Figure 5:
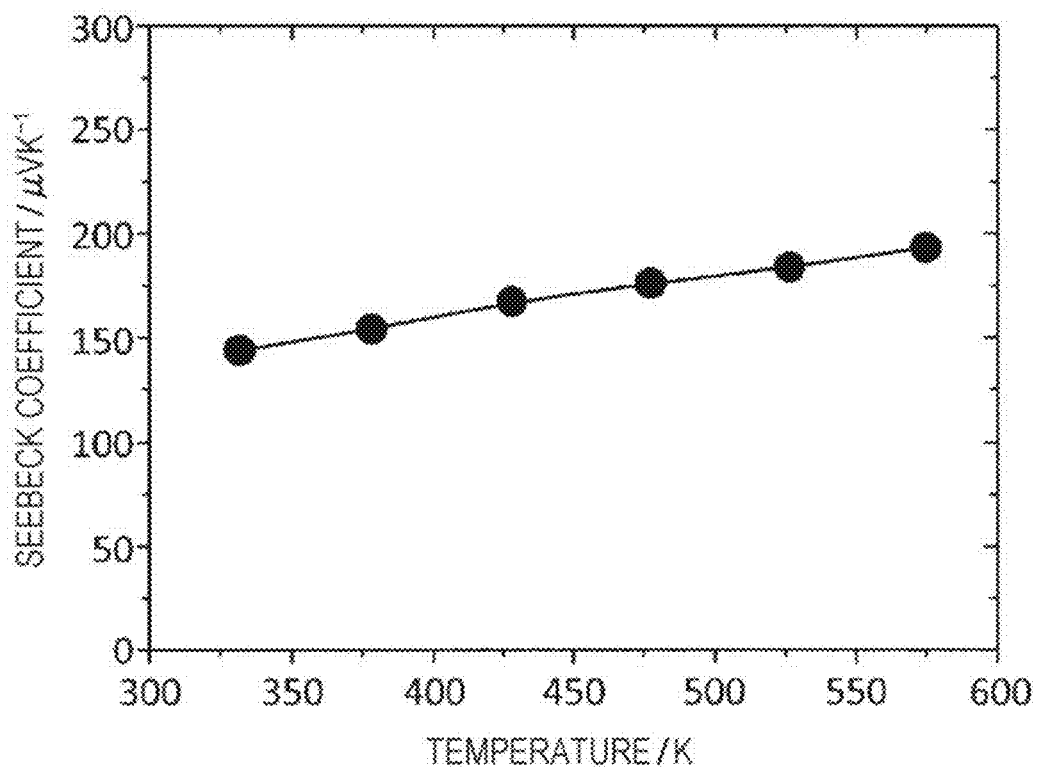
FIG. 5 is a graph showing the temperature dependence of the Seebeck coefficient of the thermoelectric conversion material, which was prepared in the Example and had a composition of $Ba_{0.5}Ca_{0.48}K_{0.02}Mg_2Bi_2$.
Figure 6:
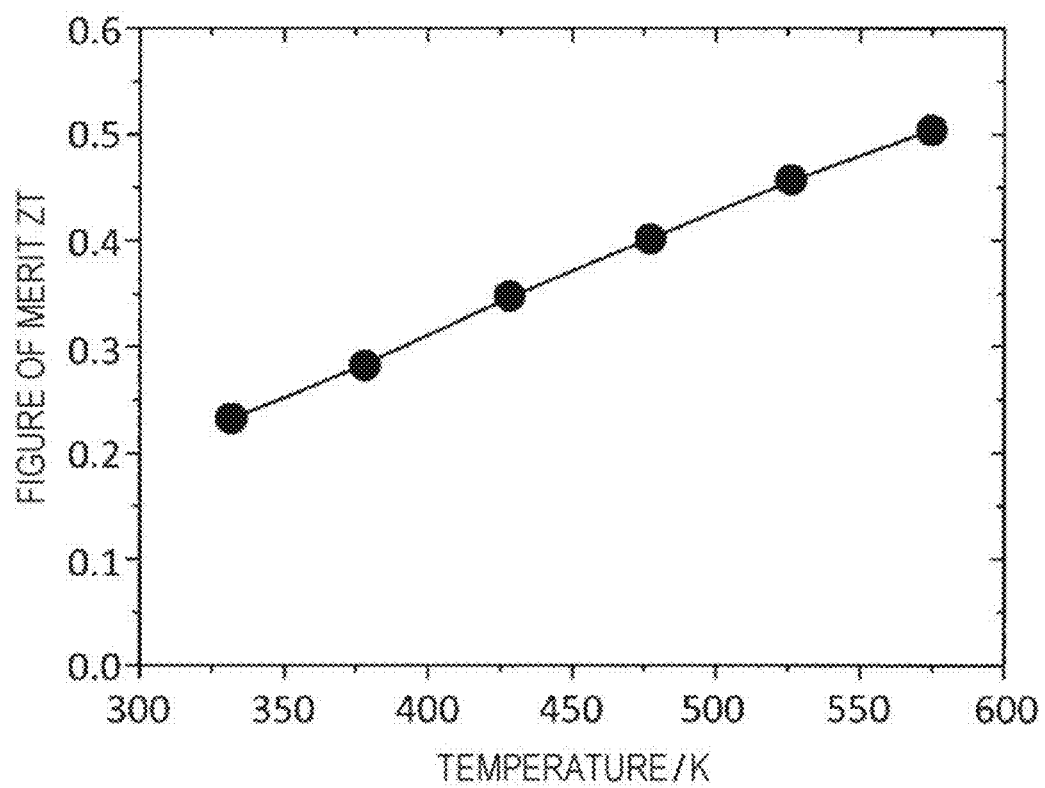
FIG. 6 is a graph showing the temperature dependence of the figure of merit ZT of the thermoelectric conversion material, which was prepared in the Example and had a composition of $Ba_{0.5}Ca_{0.48}K_{0.02}Mg_2Bi_2$.

FIG. 5 shows the temperature dependence of the Seebeck coefficient S of the thermoelectric conversion material prepared in Example 4. FIG. 6 shows the temperature dependence of the figure of merit ZT of the thermoelectric conversion material prepared in Example 4.

Computational Evaluation of Thermoelectric Conversion Properties

In addition, the thermoelectric conversion properties in the composition represented by the chemical formula of $Ba_{1-a-b-c}Sr_bCa_cK_aMg_2Bi_{2-d}Sb_d$ were predicted by using a computational science technique. The technique for the prediction is described below.

The $BaMg_2Bi_2$ crystal materials disclosed in Non-Patent Literature 1 and 2 do not include intentionally introduced defects. Accordingly, in these materials, an insufficient number of carriers are present, and, therefore, a high figure of merit ZT cannot be expected. One conceivable way to achieve a high figure of merit ZT is to, for example, substitute the crystal structure of $BaMg_2Bi_2$ with a different element. Regarding defects for generating a p-type carrier, the present inventors performed studies on defects formed by replacing each of the element Ba, the element Mg, and the element Bi with a different element. The studies were based on the premise that the $La_2O_3$-type structure, which is the crystal structure of $BaMg_2Bi_2$, would be maintained even after a defect was introduced. In other words, an assumption was made that all of the materials described below, which were the subjects of the computation, had a $La_2O_3$-type structure.

A defect formation energy $E_{form}$ was calculated for the instances in which the Ba site, the Mg site, or the Bi site was substituted with a different element in the crystal structure of $BaMg_2Bi_2$. The calculation revealed that in an instance where the Ba site is substituted with K, the p-type carrier concentration increases, whereas in an instance where the Bi site is substituted with Ge, Sn, or Pb, the p-type carrier concentration remains low. The defect formation energy $E_{form}$ was evaluated based on the following relational equation (1).

$$E_{form}(\mu_i, q, E_F) = E_{defect} - E_{pure} - \Sigma n_i \mu_i + q(E_{VBM} + E_F) \quad (1)$$

In the equation, $E_{defect}$ is the total energy for the instance in which a defect is present, $E_{pure}$ is the total energy of a perfect crystal, that is, the total energy for the instance in which no defects are present, $n_i$ is an amount of increase or decrease in an ith constituent element resulting from a defect, $\mu_i$ is the chemical potential of the ith element, q is an amount of electrical charge possessed by a defect, $E_{VBM}$ is the electron volt of the valence band upper edge of $BaMg_2Bi_2$, which is a semiconductor, and $E_F$ is the Fermi energy of the electrons. When particular defect species having a q of less than 0 have an $E_{form}$ that is lower than an $E_{form}$ of other defect species and the absolute value of which is also low, it can be understood that using such a particular defect species contributes to a stable hole-doped state and facilitates achievement of a high p-type carrier concentration.

Regarding the defect to be formed by substituting the Ba site with a different element, studies were conducted on Ge, Sn, and Pb for the possibility of using any of these elements as the different element. These elements were also candidates for the element to be used to substitute the Bi site. Ge, Sn, and Pb were selected as the candidates because these elements have a lower valence than Bi and have an ionic radius substantially equal to that of Bi. The defect formation energy $E_{form}$ for the instance in which a defect was present was calculated. The calculation revealed that in the instance where the Ba site is substituted with Ge, Sn, or Pb, the p-type carrier concentration remains low. Based on the studies, the present inventors arrived at the concept of forming a defect by substitution with K to enable the generation of p-type carriers in a $BaMg_2Bi_2$ crystal material.

The thermoelectric conversion efficiency is determined by the figure of merit ZT of a material. ZT is defined by the following relational equation (2).

$$ZT = S^2 \sigma T / (\kappa_e + \kappa_{lat}) \quad (2)$$

In the equation, S is the Seebeck coefficient, $\sigma$ is the electrical conductivity, T is the absolute temperature in the evaluation environment, $\kappa_e$ is the thermal conductivity of the electrons, and $\kappa_{lat}$ is a lattice thermal conductivity. For S, $\sigma$, and $\kappa_e$, the prediction was performed by using a combination of a density functional theory (DFT) computation technique, which utilizes the VASP code, and a parabolic band model (see Non-Patent Literature 3 (H. J. Goldsmid, "Introduction to Thermoelectricity", Chapter 3, 2010)). The following equations (3) to (6) are computation equations for determining the physical quantities according to the parabolic band model.

$$S(\eta) = k_B/e \times [2F_1(\eta)/F_0(\eta) - \eta] \quad (3)$$

$$\sigma(\eta) = e(2k_BT)^{3/2}/3\pi^2(h/2\pi)^3 \times m_d^{3/2} \mu \times F_0(\eta) \quad (4)$$

$$\kappa_e = (2k_B)^{3/2} T^{1/2}/3e\pi^2(h/2\pi)^3 \times m_d^{3/2} \mu \times [F_2(\eta) - F_1^2(\eta)/F_0(\eta)] \quad (5)$$

$$F_i(\eta) = \int_0^\infty x^i dx/(\exp[x-\eta]+1) \quad (6)$$

These physical quantities are determined when a density of state effective mass $m_d$, a mobility $\mu$, and reducing Fermi energy $\eta(=-E_F/k_BT)$ are given. The reducing Fermi energy was calculated from a defect concentration, as will be described below. The density of state effective mass $m_d$ was determined by fitting the density of states obtained from the VASP code to the following relational equation (7).

$$D_{VB}(E-E_F)=4\pi(2m_d)^{3/2}/h^3\times(E_F-E)^{1/2} \quad (7)$$

The mobility μ, which is a parameter for determining σ, was calculated according to the following theoretical equation (8) (see Non-Patent Literature 5 (H. Wang et al., in Thermoelectric Nanomaterials, ed. K. Koumoto and T. Mori, Springer, Berlin Heidelberg, vol. 182, ch. 1, 2013, pp. 3-32)).

$$\mu=\Sigma_i(8\pi)^{1/2}(h/2\pi)^4 eB/3m_i m_d^{3/2}(k_BT)^{3/2}g^2 \quad (8)$$

In the equation, e is the elementary charge, $m_i$ is the carrier effective mass of the band that appears in the valence band upper edge, B is an elastic constant, and g is deformation potential. $m_i$, B, and g were computed by using a DFT technique that uses the VASP code. Furthermore, g was computed according to a relational equation of $g=-\Delta\varepsilon/(\Delta l/l)$, which is disclosed in Non-Patent Literature 4 (J. Chen et al., "First-Principles Predictions of Thermoelectric Figure of Merit for Organic Materials: Deformation Potential Approximation", Journal of Chemical Theory and Computation, 8, 2012, pp. 3338-3347). $\Delta\varepsilon$ is the rate of change in the band edge energy level in an instance in which a lattice constant l is changed by $\Delta l$.

The lattice thermal conductivity $\kappa_{lat}$ was computed according to the following equations (9) to (11), based on the Callaway theory, which is disclosed in Non-Patent Literature 6 (J. Yang, G. P. Meisner and L. Chen, Applied Physics Letters, 85, 2004, pp. 1140-1142).

$$\kappa_{lat}=\kappa_{lat,pure}\times\tan^{-1}(u)/u \quad (9)$$

$$u^2=\pi^2\theta_d V/hv^2\times\kappa_{lat,pure}\times\Gamma \quad (10)$$

$$\Gamma=\Gamma_M+\Gamma_S \quad (11)$$

In the equations, $\theta_d$ is the Debye temperature, $\Gamma_M$ is a parameter representing a fluctuation in the atomic mass, and $\Gamma_S$ is a parameter representing a fluctuation in strain. Each of the parameters was calculated from a composition of the thermoelectric conversion material in accordance with a method disclosed in Non-Patent Literature 6.

A lattice thermal conductivity $\kappa_{lat,\ pure}$, which is a lattice thermal conductivity in an instance in which there is no lattice disorder, was computed by using the following empirical equation (12), which is based on the Debye-Callaway model, which is disclosed in Non-Patent Literature 7 (J. Yang et al., "Material descriptors for predicting thermoelectric performance", Energy & Environmental Science, 8, 2015, pp. 983-994).

$$\kappa_{lat,pure}=A_1 M v^3/V^{2/3}n^{1/3}+A_2 v/V^{2/3}(1-1/n^{2/3}) \quad (12)$$

In the equation, M is an average atomic mass, v is a longitudinal acoustic wave velocity, V is a volume per atom, and n is the number of atoms present in the unit cell. $A_1$ and $A_2$ were determined such that experimental values of the lattice thermal conductivity of a (Ba, Sr, Ca)Mg$_2$(Bi, Sb)$_2$ system could be reproduced. The use of the experimental values enables an accurate determination of $A_1$ and $A_2$, compared to instances in which the technique disclosed in Non-Patent Literature 7 is used.

Computational prediction of the figure of merit ZT involves two steps: a step of calculating the Fermi energy from the composition, or, more specifically, from the defect concentration; and a step of calculating each of the physical quantities in accordance with the calculated Fermi energy.

The reducing fermi energy and the defect concentration are associated with each other by the following relational equations (13) and (14).

$$p(E_F)=C\times N_K \quad (13)$$

$$p(E_F)=1-\int D_{VB}(E)[1-f(E;E_F)]dE \quad (14)$$

In the equations, p is the carrier concentration in the valence band, C is a carrier activation ratio, and $N_K$ is the concentration of K atoms, which are the dopant. The carrier activation ratio C was estimated to be 0.2 based on the relationship between the concentration of the introduced K and the measured value of the carrier concentration.

The relational equations (13) and (14) were solved in combination, and, accordingly, the Fermi energy, which was a parameter necessary for predicting the thermoelectric conversion properties, was estimated.

Results of Evaluation of Figure of Merit

The thermoelectric conversion properties were evaluated by using the above-described computation techniques. Table 4, Table 5, Table 6, Table 7, and Table 8 show the results of evaluation of the thermoelectric conversion properties of materials at temperatures of 330K and 470K or 570K. Table 4 relates to materials having a composition represented by the formula of $Ba_{1-a}K_aMg_2Bi_2$; Table 5 relates to materials having a composition represented by the formula of $Sr_{1-a}K_aMg_2Bi_2$ (a+b+c=1 and c=0, that is, b=1−a); Table 6 relates to materials having a composition represented by the formula of $Ca_{1-a}K_aMg_2Bi_2$ (a+b+c=1 and b=0, that is, c=1−a); Table 7 relates to materials having a composition represented by the formula of $Ba_{0.98-b-c}Sr_bCa_cK_{0.02}Mg_2Bi_2$; and Table 8 relates to materials having a composition represented by the formula of $Ba_{0.49}Ca_{0.49}K_{0.02}Mg_2Bi_{2-d}Sb_d$.

TABLE 4

[Ba$_{1-a}$K$_a$Mg$_2$Bi$_2$]

| | a | $S_{330K}$ (μV/K) | $\sigma_{330K}$ (S/cm) | $\kappa_{330K}$ (W/mK) | $ZT_{330K}$ | $ZT_{470K}$ |
|---|---|---|---|---|---|---|
| Comparative Example 3 | 0.001 | 376 | 24 | 1.74 | 0.07 | 0.08 |
| Example 6 | 0.002 | 318 | 49 | 1.75 | 0.09 | 0.12 |
| Example 7 | 0.005 | 242 | 122 | 1.79 | 0.13 | 0.18 |
| Example 8 | 0.01 | 188 | 243 | 1.85 | 0.15 | 0.23 |
| Example 9 | 0.02 | 138 | 487 | 1.99 | 0.15 | 0.26 |
| Example 10 | 0.05 | 83 | 1216 | 2.46 | 0.11 | 0.23 |
| Example 11 | 0.1 | 53 | 2433 | 3.33 | 0.07 | 0.16 |

Table 4 shows that in each of the Examples, 0.002≤a≤0.1 was satisfied, and thermoelectric conversion properties comparable to those of Example 1, in which a thermoelectric conversion material was actually synthesized and evaluated, were achieved. Furthermore, a $ZT_{330K}$ value greater than those of Comparative Examples 1, 2, and 3 was achieved.

TABLE 5

[Sr$_{1-a}$K$_a$Mg$_2$Bi$_2$]

| | a | $S_{330K}$ (μV/K) | $\sigma_{330K}$ (S/cm) | $\kappa_{330K}$ (W/mK) | $ZT_{330K}$ | $ZT_{570K}$ |
|---|---|---|---|---|---|---|
| Comparative Example 4 | 0.001 | 373 | 21 | 1.93 | 0.05 | 0.07 |
| Example 12 | 0.002 | 315 | 42 | 1.94 | 0.07 | 0.11 |
| Example 13 | 0.005 | 239 | 105 | 1.97 | 0.10 | 0.17 |
| Example 14 | 0.01 | 185 | 210 | 2.03 | 0.12 | 0.22 |

TABLE 5-continued

[$Sr_{1-a}K_aMg_2Bi_2$]

|  | a | $S_{330K}$ (μV/K) | $σ_{330K}$ (S/cm) | $κ_{330K}$ (W/mK) | $ZT_{330K}$ | $ZT_{570K}$ |
|---|---|---|---|---|---|---|
| Example 15 | 0.02 | 135 | 420 | 2.14 | 0.12 | 0.26 |
| Example 16 | 0.05 | 81 | 1050 | 2.56 | 0.09 | 0.26 |
| Example 17 | 0.1 | 52 | 2101 | 3.31 | 0.06 | 0.20 |

Table 5 shows that in each of the Examples, 0.002≤a≤0.1 was satisfied, and a $ZT_{330K}$ value greater than those of Comparative Examples 1, 2, and 4 was achieved.

TABLE 6

[$Ca_{1-a}K_aMg_2Bi_2$]

|  | a | $S_{330K}$ (μV/K) | $σ_{330K}$ (S/cm) | $κ_{330K}$ (W/mK) | $ZT_{330K}$ | $ZT_{570K}$ |
|---|---|---|---|---|---|---|
| Comparative Example 5 | 0.001 | 373 | 21 | 1.93 | 0.05 | 0.07 |
| Example 18 | 0.002 | 315 | 42 | 1.94 | 0.07 | 0.11 |
| Example 19 | 0.005 | 239 | 105 | 1.97 | 0.10 | 0.17 |
| Example 20 | 0.01 | 185 | 210 | 2.03 | 0.12 | 0.22 |
| Example 21 | 0.02 | 135 | 420 | 2.14 | 0.12 | 0.26 |
| Example 22 | 0.05 | 81 | 1050 | 2.56 | 0.09 | 0.26 |
| Example 23 | 0.1 | 52 | 2101 | 3.31 | 0.06 | 0.20 |

Table 6 shows that in each of the Examples, 0.002≤a≤0.1 was satisfied, and thermoelectric conversion properties comparable to those of Example 2, in which a thermoelectric conversion material was actually synthesized and evaluated, were achieved. Furthermore, a $ZT_{330K}$ value greater than those of Comparative Examples 1, 2, and 5 was achieved.

TABLE 7

[$Ba_{0.98-b-c}Sr_bCa_cK_{0.02}Mg_2Bi_2$]

|  | b | c | $S_{330K}$ (μV/K) | $σ_{330K}$ (S/cm) | $κ_{330K}$ (W/mK) | $ZT_{330K}$ | $ZT_{570K}$ |
|---|---|---|---|---|---|---|---|
| Example 24 | 0.245 | 0 | 138 | 479 | 1.78 | 0.17 | 0.37 |
| Example 25 | 0.49 | 0 | 139 | 473 | 1.76 | 0.17 | 0.37 |
| Example 26 | 0.735 | 0 | 139 | 466 | 1.84 | 0.16 | 0.35 |
| Example 27 | 0 | 0.245 | 137 | 469 | 1.16 | 0.25 | 0.58 |
| Example 28 | 0 | 0.49 | 137 | 453 | 1.17 | 0.24 | 0.54 |
| Example 29 | 0 | 0.735 | 136 | 436 | 1.40 | 0.19 | 0.43 |
| Example 30 | 0.735 | 0.245 | 138 | 451 | 1.57 | 0.18 | 0.40 |
| Example 31 | 0.49 | 0.49 | 137 | 441 | 1.56 | 0.18 | 0.39 |
| Example 32 | 0.245 | 0.735 | 137 | 431 | 1.73 | 0.15 | 0.34 |
| Example 33 | 0.245 | 0.245 | 138 | 463 | 1.24 | 0.23 | 0.53 |
| Example 34 | 0.245 | 0.49 | 137 | 447 | 1.32 | 0.21 | 0.47 |
| Example 35 | 0.49 | 0.245 | 138 | 456 | 1.37 | 0.21 | 0.47 |

Table 7 shows that in each of the Examples, 0≤b+c≤1−a was satisfied, and thermoelectric conversion properties comparable to those of Example 3 or 4, in which a thermoelectric conversion material was actually synthesized and evaluated, were achieved. Furthermore, a ZT value greater than those of Comparative Examples 1 and 2 was achieved.

TABLE 8

[$Ba_{0.49}Ca_{0.49}K_{0.02}Mg_2Bi_{2-d}Sb_d$]

|  | d | $S_{330K}$ (μV/K) | $σ_{330K}$ (S/cm) | $κ_{330K}$ (W/mK) | $ZT_{330K}$ | $ZT_{570K}$ |
|---|---|---|---|---|---|---|
| Example 36 | 0 | 137 | 453 | 1.17 | 0.24 | 0.54 |
| Example 37 | 0.25 | 134 | 451 | 1.01 | 0.27 | 0.62 |

TABLE 8-continued

[$Ba_{0.49}Ca_{0.49}K_{0.02}Mg_2Bi_{2-d}Sb_d$]

|  | d | $S_{330K}$ (μV/K) | $σ_{330K}$ (S/cm) | $κ_{330K}$ (W/mK) | $ZT_{330K}$ | $ZT_{570K}$ |
|---|---|---|---|---|---|---|
| Example 38 | 0.5 | 132 | 448 | 0.95 | 0.27 | 0.64 |
| Example 39 | 1 | 126 | 441 | 0.94 | 0.25 | 0.59 |
| Example 40 | 1.5 | 121 | 432 | 1.01 | 0.20 | 0.50 |
| Example 41 | 2 | 115 | 418 | 1.20 | 0.15 | 0.37 |

Table 8 shows that in each of the Examples, 0≤d≤2 was satisfied, and thermoelectric conversion properties comparable to those of Example 5, in which a thermoelectric conversion material was actually synthesized and evaluated, were achieved. Furthermore, a ZT value greater than those of Comparative Examples 1 and 2 was achieved.

Thermoelectric conversion materials of the present disclosure can be used in thermoelectric conversion devices and thermoelectric conversion modules for converting thermal energy into electrical energy.

What is claimed is:

1. A thermoelectric conversion material having a composition represented by a chemical formula of $Ba_{1-a-b-c}Sr_bCa_cK_aMg_2Bi_{2-d}Sb_d$, where $0.002 ≤ a ≤ 0.1$, $0 ≤ b$, $0 ≤ c$, $a+b+c ≤ 1$, and $0 ≤ d ≤ 2$, wherein
the thermoelectric conversion material has a $La_2O_3$-type crystal structure.

2. The thermoelectric conversion material according to claim 1, wherein
the thermoelectric conversion material has a p-type polarity.

3. A p-type thermoelectric conversion device, comprising a thermoelectric converter,
wherein
the thermoelectric converter comprises the thermoelectric conversion material according to claim 1.

4. A thermoelectric conversion device comprising:
a p-type thermoelectric converter;
an n-type thermoelectric converter;

a first electrode;
a second electrode; and
a third electrode,
wherein
a first end of the p-type thermoelectric converter and a first end of the n-type thermoelectric converter are electrically connected to each other via the first electrode,
a second end of the p-type thermoelectric converter is electrically connected to the second electrode,
a second end of the n-type thermoelectric converter is electrically connected to the third electrode, and
the p-type thermoelectric converter comprises the thermoelectric conversion material according to claim 1.

5. A method for obtaining electrical power by using the thermoelectric conversion material according to claim 1, the method comprising:
applying a temperature difference to the thermoelectric conversion material.

6. A method for transporting heat by using the thermoelectric conversion material according to claim 1, the method comprising:
applying a current to the thermoelectric conversion material.

* * * * *